(12) United States Patent
Selvamanickam

(10) Patent No.: US 10,991,836 B2
(45) Date of Patent: Apr. 27, 2021

(54) ARCHITECTURES ENABLING BACK CONTACT BOTTOM ELECTRODES FOR SEMICONDUCTOR DEVICES

(71) Applicant: University of Houston System, Houston, TX (US)

(72) Inventor: Venkat Selvamanickam, Houston, TX (US)

(73) Assignee: University of Houston System, Houston, TX (US)

( * ) Notice: Subject to any disclaimer, the term of this patent is extended or adjusted under 35 U.S.C. 154(b) by 109 days.

(21) Appl. No.: 16/085,422

(22) PCT Filed: Mar. 15, 2017

(86) PCT No.: PCT/US2017/022437
§ 371 (c)(1),
(2) Date: Sep. 14, 2018

(87) PCT Pub. No.: WO2017/160929
PCT Pub. Date: Sep. 21, 2017

(65) Prior Publication Data
US 2019/0074393 A1 Mar. 7, 2019

Related U.S. Application Data

(60) Provisional application No. 62/308,555, filed on Mar. 15, 2016.

(51) Int. Cl.
H01L 31/0392 (2006.01)
C30B 23/02 (2006.01)
(Continued)

(52) U.S. Cl.
CPC ............ *H01L 31/0392* (2013.01); *B32B 9/04* (2013.01); *B32B 19/00* (2013.01); *C30B 23/025* (2013.01);
(Continued)

(58) Field of Classification Search
CPC .......... H01L 31/0392; H01L 31/03926; H01L 31/0687; H01L 31/0725; H01L 31/076
See application file for complete search history.

(56) References Cited

U.S. PATENT DOCUMENTS 6,998,153 B2    2/2006  Chiang et al.
2002/0144725 A1 10/2002 Jordan et al.
(Continued)

OTHER PUBLICATIONS

Cantoni, C., et al., "Conductive Buffer Layers and Overlayers for the Thermal Stability of Coated Conductors," IEEE Trans. Appl. Supercond. 11, 4 pages (2001).
(Continued)

*Primary Examiner* — Lindsey A Bernier
(74) *Attorney, Agent, or Firm* — Blank Rome LLP

(57) ABSTRACT

A semiconductor device and method for fabricating same is disclosed. Embodiments are directed to a semiconductor device and fabrication of same which include a polycrystalline or amorphous substrate. An electrically conductive Ion Beam-Assisted Deposition (IBAD) template layer is positioned above the substrate. At least one electrically conductive hetero-epitaxial buffer layer is positioned above the IBAD template layer. The at least one buffer layer has a resistivity of less than 100 μΩcm. The semiconductor device and method foster the use of bottom electrodes thereby avoiding complex and expensive lithography processes.

17 Claims, 6 Drawing Sheets

(51) Int. Cl.

| | | |
|---|---|---|
| *C30B 29/06* | (2006.01) | |
| *C30B 29/08* | (2006.01) | |
| *C30B 29/42* | (2006.01) | |
| *H01L 31/0224* | (2006.01) | |
| *B32B 19/00* | (2006.01) | |
| *B32B 9/04* | (2006.01) | |
| *C30B 25/18* | (2006.01) | |
| *H01L 31/0687* | (2012.01) | |
| *H01L 31/0725* | (2012.01) | |
| *H01L 31/076* | (2012.01) | |
| *H01L 31/0216* | (2014.01) | |
| *H01L 31/028* | (2006.01) | |
| *H01L 31/0304* | (2006.01) | |
| *H01L 31/18* | (2006.01) | |

(52) U.S. Cl.
CPC ............ *C30B 25/18* (2013.01); *C30B 25/183* (2013.01); *C30B 29/06* (2013.01); *C30B 29/08* (2013.01); *C30B 29/42* (2013.01); *H01L 31/028* (2013.01); *H01L 31/02168* (2013.01); *H01L 31/022425* (2013.01); *H01L 31/0304* (2013.01); *H01L 31/03921* (2013.01); *H01L 31/03926* (2013.01); *H01L 31/0687* (2013.01); *H01L 31/076* (2013.01); *H01L 31/0725* (2013.01); *H01L 31/1804* (2013.01); *H01L 31/184* (2013.01); *Y02E 10/50* (2013.01)

(56) References Cited

U.S. PATENT DOCUMENTS

| | | |
|---|---|---|
| 2003/0015725 A1 | 1/2003 | Droopad et al. |
| 2006/0021565 A1 | 2/2006 | Zahler et al. |
| 2006/0033160 A1 | 2/2006 | Findikoglu et al. |
| 2006/0115964 A1 | 6/2006 | Findikoglu et al. |
| 2006/0208257 A1 | 9/2006 | Branz et al. |
| 2008/0090072 A1 | 4/2008 | Findikoglu |
| 2008/0197327 A1 | 8/2008 | Arendt et al. |
| 2008/0217622 A1* | 9/2008 | Goyal ................ H01L 21/0237 257/64 |
| 2009/0133743 A1 | 5/2009 | Matsui |
| 2012/0288673 A1 | 11/2012 | Clemens et al. |
| 2013/0052421 A1 | 2/2013 | Wiesner et al. |
| 2014/0166101 A1 | 6/2014 | Myoung et al. |

OTHER PUBLICATIONS

Dutta, P. et al., "Epitaxial thin film GaAs deposited by MOCVD on Low-Cost, Flexible Substrates for High Efficiency Photovoltaics," Proc. 39th IEEE Photovoltaic Specialists Conference (PVSC), 3393-3396 (2013).

Selvamanickam, V., et al., "Germanium films with strong in-plane and out-of-plane texture on flexible, randomly textured metal substrates," J. Crystal Growth 311, 4553-4557 (2009).

Selvamanickam, et al., "High Performance 2G Wire: From R&D to Pilot-scale Manufacturing," IEEE Transactions on Applied Superconductivity, 19, 3225-3230 (Jun. 2009).

Wang, C. P., et al., "Deposition of in-plane textured MgO on amorphous Si3N4 substrates by ion-beam-assisted desposition and comparisons with ion-beam-assisted deposited yttria-stabilized-zirconia," Appl. Phys. Lett. 71, 2955-2957 (1997).

Wang, R., et al., "High mobility single-crystalline-like germanium thin films on flexible, inexpensive substrates," Thin Solid Films 527, 9-15 (2013).

International Search Report dated Jun. 9, 2017; International Application No. PCT/US2017/022437; International Filing Date: Mar. 15, 2017; 2 pages.

Written Opinion dated Jun. 9, 2017; International Application No. PCT/US2017/022437; International Filing Date: Mar. 15, 2017; 7 pages.

Zhao, et al., "Thermal stability study of NiSi and NiSi2 thin films," Microelectronic Engineering 71 (2004) 104-111.

\* cited by examiner

ARCHITECTURES ENABLING BACK CONTACT BOTTOM ELECTRODES FOR SEMICONDUCTOR DEVICES

CROSS REFERENCE TO RELATED APPLICATION(S)

This application is a national phase of PCT/US17/22437, filed Mar. 15, 2017, which claims priority to U.S. provisional patent application No. 62/308,555, filed on Mar. 15, 2016, which is hereby incorporated herein by reference in its entirety.

GOVERNMENT SPONSORSHIP

None.

FIELD OF THE DISCLOSURE

Embodiments are in the field of semiconductor devices. More particularly, embodiments disclosed herein relate to semiconductor devices and methods for manufacturing same via use of electrically conductive buffer layers for devices fabricated using Ion Beam-Assisted Deposition (IBAD) template layers which, inter alia, foster the use of bottom electrodes and which avoid complex and expensive lithography processes to fabricate the bottom electrodes.

BACKGROUND

Thin film manufacturing of advanced materials is widely employed in microelectronics, photovoltaics (PV), solid-state lighting, flat panel displays, magnetic hard drives, optics, and optoelectronics. In most of these and other applications, the thin films are deposited on rigid, small-area wafers in batch processes, which typically results in a high manufacturing cost when extended to large areas. The following examples in photovoltaics and large-area electronics illustrate the costs challenges.

III-V compound semiconductors (based on GaAs, InGaP etc.) are utilized in high-efficiency photovoltaics. These films are deposited by epitaxial growth on single crystal wafers such as Ge or GaAs. By far, the highest solar cell efficiencies have been achieved with III-V compound semiconductor PVs, including one-sun efficiencies over 37%. Unfortunately, these PVs are expensive because they rely on Ge or GaAs crystalline wafers, which could amount to up to 50% of the total module cost. Due to their high cost, the use of III-V compound semiconductor materials in terrestrial applications has been limited to concentrator PVs for the utilities industry.

Flexible electronics are being used for applications such as sensors, displays, radiation detectors, wearable, and medical devices. Crystalline silicon fabrication platforms are costly and typically yields form factors not adequate for large scale, inexpensive flexible electronics. Hence flexible electronics are typically made using amorphous silicon; however, the performance of amorphous silicon is far inferior to that of crystalline silicon, which limits the performance and capability of flexible electronics. For example, the carrier mobility values of amorphous silicon and organic semiconductors used in flexible electronics are about 1-10 $cm^2$/Vs compared to about 100 $cm^2$/Vs of polysilicon and about 500 $cm^2$/Vs of single-crystalline Si. As a result of the low carrier mobility, key performance metrics such as switching speed of thin film transistors (TFTs) fabricated with amorphous Si and organic semiconductors are far below that of TFTs made with crystalline silicon. The below Table 1 shows the differences in characteristics between crystalline and non-crystalline materials.

TABLE 1

Comparison of two major technological platforms in semiconductor electronics and photonics

|  | Crystalline materials | Non-crystalline materials |
| --- | --- | --- |
| Substrate | Single crystal | Non-single crystal |
| Cost | High | Low |
| Performance characteristics | Superior | Inferior |
| Versatility | Brittle | Flexible |
| Area | Small | Large |

As shown above, crystalline materials (e.g., crystalline silicon) have superior performance (i.e., high mobility), and are therefore suitable for small-area electronics, but are expensive and brittle. Non-crystalline materials (e.g., amorphous silicon) have lower performance (i.e. low mobility), but are inexpensive and flexible, and therefore suitable for large-area electronics.

There is a need for fabricating various advanced materials in an epitaxial form by roll-to-roll processing on inexpensive, flexible metal substrates and glass substrates. The enabling technology to achieve such epitaxial thin films on these substrates is Ion Beam-Assisted Deposition (IBAD). In the IBAD process, materials with rock-salt structures such as magnesium oxide (MgO) are deposited on amorphous layers on any substrate, with simultaneous ion beam bombardment. Under proper conditions, within a first few nanometers of the film, a good degree of biaxial crystallographic orientation is achieved. Grains are aligned with respect to each other both in-plane and out-of-plane resembling a single-crystalline-like texture. Kilometer lengths of these IBAD-based templates (or template layers) are routinely produced with a spread in in-plane texture of about 6° full width at half-maximum (FWHM).

The above-described single-crystalline-like IBAD MgO films have been employed as templates for epitaxial growth of superconducting thin films on kilometer-long polycrystalline metal substrates with critical current densities as high as those achieved on single crystal substrates. These tapes are routinely produced in lengths of hundreds of meters with current carrying capability 300 times more than a comparably-sized copper wire.

IBAD templates have also been employed to fabricate epitaxial germanium that is nanocrystalline, in lengths of meters on inexpensive metal substrates. For example, FIG. 1 is a perspective schematic diagram illustrating a prior art III-V photovoltaic cell structure. The cell structure has an architecture of epitaxial GaAs solar cell deposited on single-crystalline-like germanium above IBAD templates deposited above inexpensive metal substrates.

Meter-long tapes of germanium thin films are routinely fabricated on inexpensive metal substrates with grains aligned within 1° with respect to each other. These fabrication processes have achieved Hall mobility values in excess of 900 $cm^2$/Vs. Furthermore, GaAs epitaxial thin films have been successfully grown on germanium thin films using metal organic chemical vapor deposition (MOCVD). The MOCVD process can achieve an electron mobility over 800 $cm^2$/Vs in the Se-doped flexible GaAs film, and a hole mobility of over 100 $cm^2$/Vs in the Zn-doped flexible GaAs film. The process can also achieve controllable doping levels from $10^{17}$-$10^{19}$ $cm^{-3}$, which is critical for device structure.

While the above fabrication processes can successfully achieve advanced materials in an epitaxial form on flexible metal substrates, there are limitations to the current technology. For example, for semiconductor devices fabricated on flexible metal substrates, due to the presence of insulating oxide buffer layers between the device layers and the substrate, there is a need for front/top contacts for the back/bottom electrodes. For example, FIG. 2 illustrates a perspective schematic diagram illustrating a prior art single-junction thin film III-V solar cell structure or Silicon (Si) semiconductor device using insulating epitaxial oxide layers deposited above and on an Ion Beam-Assisted Deposition (IBAD) template layer such as $CeO_2$, $LaMnO_3$, MgO. The IBAD layer is deposited on insulating oxide buffer layers, including $Y_2O_3$ and/or $Al_2O_3$. The presence of insulating oxide buffer layers in the architecture requires a front/top contact for a back/bottom electrode in addition to a front/top electrode because the circuit cannot be completed through the insulating layers. This is problematic since it reduces the semiconductor device's active area, which limits the power output of the solar cell. Additionally, complex lithography techniques are required to pattern the front contacts for the bottom electrode, which substantially increases the cost of fabrication and potentially reduces yield.

It is therefore desirable to provide a semiconductor device fabricated using Ion Beam-Assisted Deposition (IBAD) template layer(s) that avoids complex and expensive lithography processes, and that does not suffer from the above drawbacks. These and other advantages of the present invention will become more fully apparent from the detailed description of the invention herein below.

SUMMARY

Embodiments are directed to a semiconductor device comprising: a polycrystalline or amorphous substrate; an electrically conductive Ion Beam-Assisted Deposition (IBAD) template layer positioned above the substrate; and at least one electrically conductive hetero-epitaxial buffer layer positioned above the IBAD template layer. The at least one buffer layer has a resistivity of less than 100 $\mu\Omega$cm.

In an embodiment, the IBAD template layer comprises Titanium Nitride (TiN).

In an embodiment, the at least one buffer layer does not comprise an oxide.

In an embodiment, the at least one buffer layer comprises a fluorite structure.

In an embodiment, the at least one buffer layer comprises Nickel Silicide ($NiSi_2$).

In an embodiment, the semiconductor device further comprises an electrically conductive amorphous layer positioned between the substrate and the IBAD template layer.

In an embodiment, the amorphous layer comprises Titanium Nitride (TiN) or Tantalum-Nickel (Ta—Ni).

In an embodiment, the semiconductor device further comprises an epitaxial Si film or an epitaxial Ge film positioned above the buffer layer.

In an embodiment, the semiconductor device further comprises an epitaxial Si film positioned above the buffer layer, and p-doped and n-doped silicon positioned above the epitaxial Si film, thereby forming a solar cell device or flexible electronics device.

In an embodiment, the semiconductor device further comprises an epitaxial Ge film positioned above the buffer layer, and epitaxial GaAs film positioned on the epitaxial Ge film, and epitaxial p-doped and epitaxial n-doped GaAs layers positioned on the epitaxial GaAs film, thereby forming a solar cell device.

In an embodiment, the substrate comprises metal.

In an embodiment, the substrate comprises metal and functions as a bottom electrode.

In an embodiment, the substrate comprises glass.

In an embodiment, the semiconductor device further comprises a bottom electrode positioned below and attached to the substrate.

In an embodiment, the substrate is Hastelloy C-276 or Stainless Steel or Ni—W or Ni—Cr or Inconel or copper or a combination thereof.

In an embodiment, the semiconductor device further comprises a homo-epitaxial layer positioned between the IBAD template layer and the buffer layer.

In an embodiment, the homo-epitaxial layer comprises TiN.

Embodiments are also directed to a method for fabricating a semiconductor device. The method comprises: providing a polycrystalline or amorphous substrate; depositing an electrically conductive Ion Beam-Assisted Deposition (IBAD) template layer on the substrate; and depositing at least one electrically conductive hetero-epitaxial buffer layer on the IBAD template layer. The at least one buffer layer has a resistivity of less than 100 $\mu\Omega$cm.

In an embodiment, the depositing of the IBAD template layer is performed via dual ion sources.

In an embodiment, the depositing of the buffer layer is performed via magnetron sputtering.

In an embodiment, the method further comprises depositing a homo-epitaxial layer between the depositing of the IBAD template layer and the depositing of the buffer layer.

In an embodiment, the depositing of the homo-epitaxial layer is performed via magnetron sputtering.

In an embodiment, the method further comprises depositing an epitaxial Si film or an epitaxial Ge film on the buffer layer.

In an embodiment, the depositing of the epitaxial Si film or the epitaxial Ge film is performed via magnetron sputtering or plasma enhanced chemical vapor deposition (PECVD).

In an embodiment, the method further comprises depositing an epitaxial Si film above the buffer layer, and depositing p-doped and n-doped silicon above the epitaxial Si film, thereby forming a solar cell device or flexible electronics device.

In an embodiment, the method further comprises depositing an epitaxial Ge film above the buffer layer, and depositing epitaxial GaAs film on the epitaxial Ge film, and depositing epitaxial p-doped and epitaxial n-doped GaAs layers on the epitaxial GaAs film, thereby forming a solar cell device.

In an embodiment, the method further comprises depositing p-doped and n-doped electrically conductive semiconductor layers which are Si-based and III-V-based above the epitaxial Si film or the epitaxial Ge film.

In an embodiment, the method further comprises depositing a bottom electrode on a bottom surface of the substrate.

In an embodiment, the method further comprises depositing an electrically conductive amorphous layer between the substrate and the IBAD template layer.

In an embodiment, the amorphous layer comprises Titanium Nitride (TiN) or Tantalum-Nickel (Ta—Ni).

In an embodiment, the depositing of the amorphous layer is performed via magnetron sputtering.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Figure 1:
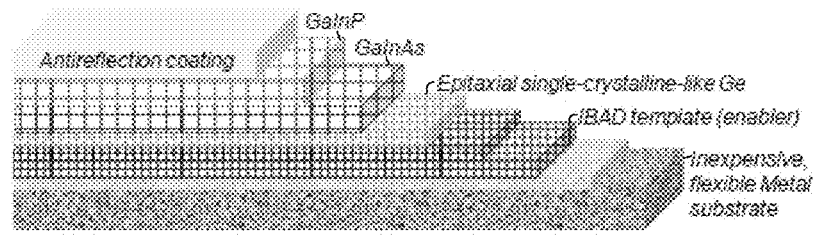
FIG. 1 is a perspective schematic diagram illustrating a prior art III-V photovoltaic cell structure based on a single-crystalline-like germanium thin film deposited above a flexible metal substrate.

It is to be understood that the figures and descriptions of the present invention may have been simplified to illustrate elements that are relevant for a clear understanding of the present invention, while eliminating, for purposes of clarity, other elements found in a typical semiconductor device or typical method for fabricating a semiconductor device. Those of ordinary skill in the art will recognize that other elements may be desirable and/or required in order to implement the present invention. However, because such elements are well known in the art, and because they do not facilitate a better understanding of the present invention, a discussion of such elements is not provided herein. It is also to be understood that the drawings included herewith only provide diagrammatic representations of the presently preferred structures of the present invention and that structures falling within the scope of the present invention may include structures different than those shown in the drawings. Reference will now be made to the drawings wherein like structures are provided with like reference designations.

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented devices, systems, methods, features, and advantages will be or become apparent to one with skill in the art upon examining the drawings and the detailed description herein. It's intended that all such additional devices, systems, methods, features, and advantages be protected by the accompanying claims.

For purposes of this disclosure, the terms "film" and "layer" may be used interchangeably.

It is an objective of the embodiments described herein to provide semiconductor devices and corresponding methods of manufacturing semiconductor devices that foster the use of bottom electrodes and which avoid complex and expensive lithography processes.

An embodiment of the present disclosure includes an architecture that would enable back/bottom contacts for back/bottom electrodes for semiconductor devices fabricated using IBAD templates deposited on, for example, flexible metal substrates or glass substrates. A schematic of an exemplary architecture that enables such bottom contacts for bottom electrodes is shown in FIG. 3.

Figure 3:
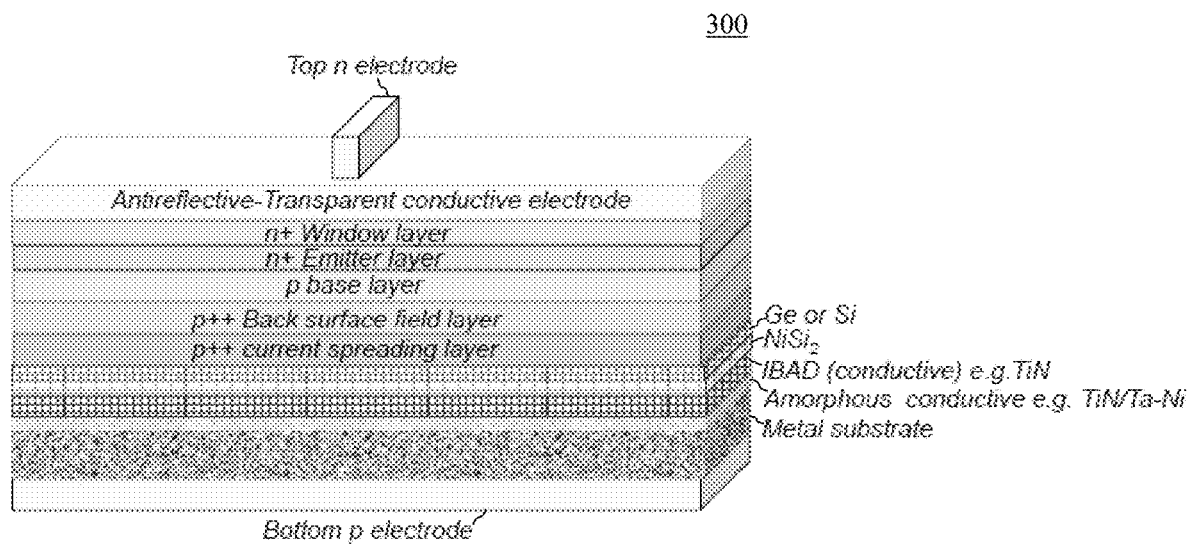
FIG. 3 is a perspective schematic diagram illustrating an embodiment of a III-V or Silicon (Si) semiconductor device with a bottom electrode deposited as a bottom contact below the metal substrate, in accordance with an embodiment.

FIG. 3, by way of example only, is a perspective schematic diagram illustrating an embodiment of a III-V or Si semiconductor device using electrically conductive epitaxial non-oxide layers deposited above and/or on an electrically conductive IBAD template layer. The IBAD template layer is deposited on an electrically conductive amorphous layer of Titanium Nitride (TiN) or Tantalum-Nickel (Ta—Ni). The amorphous layer is deposited on a metal substrate. Alternatively, the electrically conductive IBAD template layer is deposited directly on the substrate. The bottom electrode is deposited as a bottom contact below the metal substrate. The metal substrate may be formed of an electrically conductive metal, such as a metal selected from the group consisting of Hastelloy C-276, copper, Ni—W, Ni—Cr, Stainless Steel, Inconel, and combinations thereof. Other substrate materials such as glass or quartz may alternatively be employed. The electrically conductive amorphous layer may be optional. If the amorphous layer is omitted, the IBAD template layer would be deposited directly on the substrate.

Figure 2:
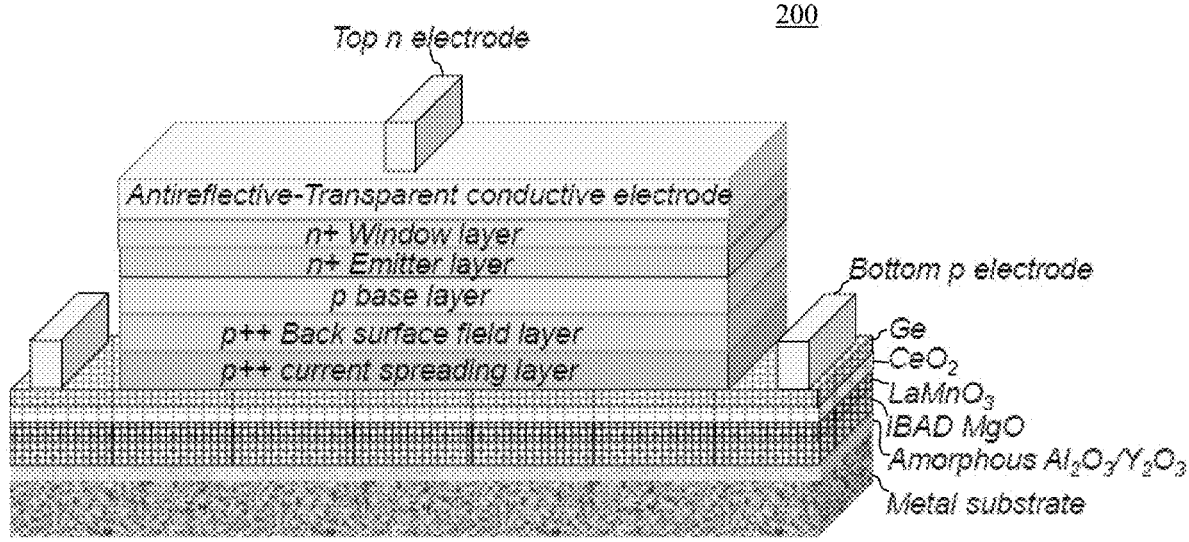
FIG. 2 is a perspective schematic diagram illustrating a prior art III-V or Silicon (Si) semiconductor device using insulating epitaxial oxide layers deposited above and on an Ion Beam-Assisted Deposition (IBAD) template layer, which is deposited on amorphous $Al_2O_3$ or $Y_2O_3$ (oxide) layer, which is deposited on a metal substrate.

By using a semiconductor device architecture with an epitaxial, electrically-conductive non-oxide buffer layer(s) that is/are compatible with Ge, Si, and/or III-V semiconductor layers ultimately provided on (e.g., optionally flexible) metal or glass substrates, the device can be fabricated with a bottom contact bottom electrode as shown, for example, in FIG. 3. This configuration avoids the aforementioned complex and expensive lithography processes otherwise needed to fabricate bottom electrodes such as the prior art semiconductor device shown in FIG. 2. Additionally, with a bottom contact bottom electrode (again, for example, shown in FIG. 3), no valuable device surface area is lost that could otherwise be used for capture of photons in solar cells. Using this novel architecture, high quality Ge, Si, and/or III-V compound semiconductors may be used for semiconductor devices such as low-cost, high efficiency photovoltaics and high performance flexible electronics on flexible substrates.

In another embodiment, the III-V or Si semiconductor device can use conducting fluorite (i.e., a specific type of crystal structure) material(s) for at least one electrically conductive buffer layer. For example, in one embodiment, the electrically conductive buffer layer(s) may use non-oxide electrically conducting fluorite material(s). Previously, it has been shown that perovskite (oxide) (i.e., another specific type of crystal structure) materials such as $SrRuO_3$ and $LaNiO_3$ with resistivities of 300 μΩcm and 600 μΩcm, respectively, can serve as electrically conductive buffers in architectures made using substrates by the Rolling Assisted Biaxially Textured Substrates (RABiTS) process. However, perovskite materials cannot be used as buffers on IBAD templates for subsequent epitaxial growth of semiconductor films such as germanium, because of structural mismatch. Additionally, oxide buffer layers have been found to be unstable during the growth of Ge, Si and GaAs where a reducing hydrogen-containing atmosphere is used.

In an alternative embodiment, as illustrated in FIG. 3 by way of example only, an electrically conductive non-oxide fluorite material, such as $NiSi_2$, can be grown as a heteroepitaxial buffer on an IBAD template layer. Furthermore, in still another embodiment, any electrically conductive non-oxide fluorite material can be grown as an epitaxial buffer layer on the IBAD template, including but not limited to $NiSi_2$.

As shown in FIG. 3, all layers in the architecture below the p-doped and n-doped semiconductor layers (Si-based or III-V-based) may be electrically conductive. Thus, in alternative embodiments, either the metal substrate itself may be used as the bottom electrode, or a separate bottom electrode may be connected to the bottom of the non-metal or metal substrate.

In yet another embodiment, the IBAD template layer illustrated in FIG. 3 may be deposited on glass substrate(s). Alternatively, a layer of metal, such as molybdenum, can be deposited on a glass substrate, followed by deposition of an electrically conductive IBAD template layer, followed by deposition of an electrically conductive buffer (e.g., fluorite material), and followed by deposition of subsequent semiconductor layers. In this configuration, the back contact is made to the metal that is directly deposited on the glass substrate.

Figure 4:
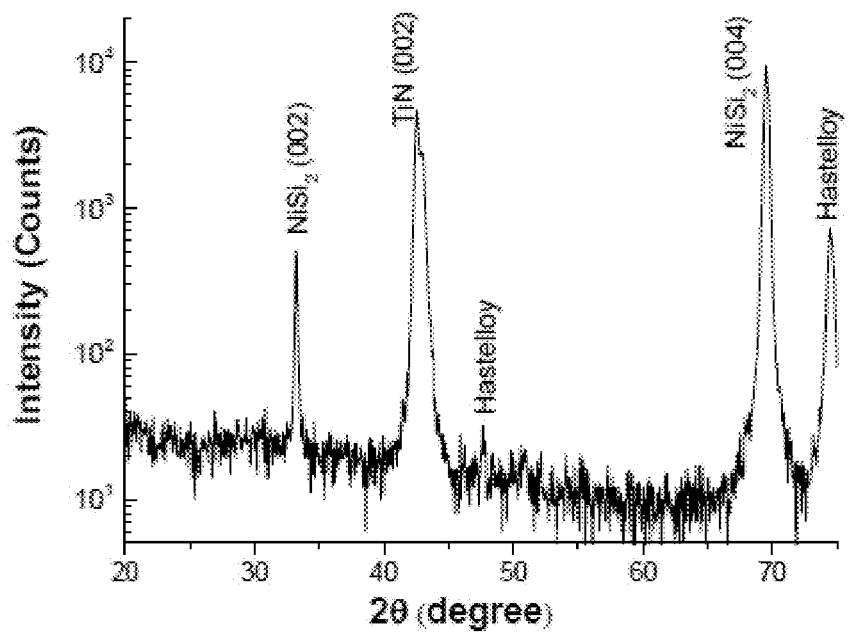
FIG. 4 is a graph illustrating a Theta-2theta ($\theta$-2$\theta$) X-ray diffraction scan of an epitaxial $NiSi_2$ buffer layer deposited on an electrically-conductive IBAD template layer such as TiN on a metal substrate, in accordance with an embodiment.

FIG. 4, by way of example only, is a graph illustrating a Theta-2theta (θ-2θ) X-ray diffraction scan of an epitaxial electrically conductive $NiSi_2$ buffer layer deposited (i.e., grown) on an epitaxial TiN layer which is deposited on an IBAD template layer. The IBAD template layer is deposited on a metal substrate with an intervening amorphous layer. As illustrated in the graph of FIG. 4, only (001) peaks of $NiSi_2$ are present, indicating strong out-of-plane texture. Only (002) and (004) peaks of $NiSi_2$ are present, indicating preferred out-of-plane texture and thus indicating epitaxial growth. No other peaks corresponding to non-(001) orientations are visible.

Figure 5:
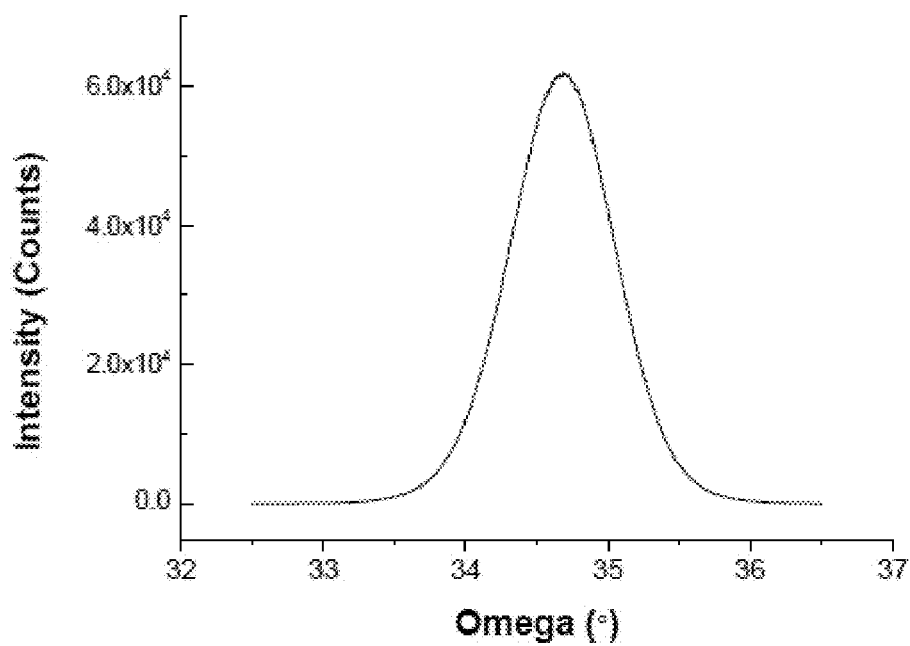
FIG. 5 is a graph illustrating an X-ray diffraction rocking curve of (004) peak of an epitaxial $NiSi_2$ buffer layer deposited on a TiN film on an IBAD template layer on a metal substrate, in accordance with an embodiment.

FIG. 5, by way of example only, is a graph illustrating an X-ray diffraction rocking curve of $NiSi_2$ (004) peak of an epitaxial $NiSi_2$ buffer layer deposited on an epitaxial TiN layer which is deposited on an IBAD template layer. The IBAD template layer is deposited on a metal substrate with an intervening amorphous layer. As illustrated in the graph of FIG. 5, a narrow peak width for $NiSi_2$ is seen, indicating strong out-of-plane texture. The graph shows a relatively sharp texture spread of 0.87° full-width-at-half-maximum (FWHM).

Figure 6:
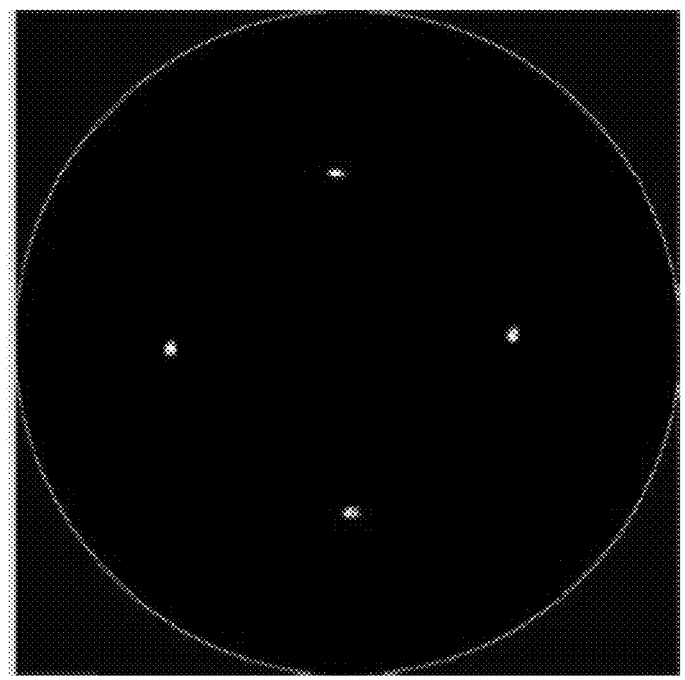
FIG. 6 is a plot illustrating an X-ray diffraction polefigure of (111) peak of an epitaxial $NiSi_2$ buffer layer deposited on a TiN film on an IBAD template layer deposited on a metal substrate, in accordance with an embodiment.

FIG. 6, by way of example only, is a plot illustrating an X-ray diffraction polefigure of $NiSi_2$ (111) peak of an epitaxial $NiSi_2$ buffer layer deposited on an epitaxial TiN layer which is deposited on an IBAD template layer. The IBAD template layer is deposited on a metal substrate with an intervening amorphous layer. As illustrated in the plot of FIG. 6, only four sharp poles of $NiSi_2$ are visible with no other orientation, indicating strong in-plane texture and confirming a strong epitaxial growth of $NiSi_2$ on the TiN of the IBAD template layer.

Figure 7:
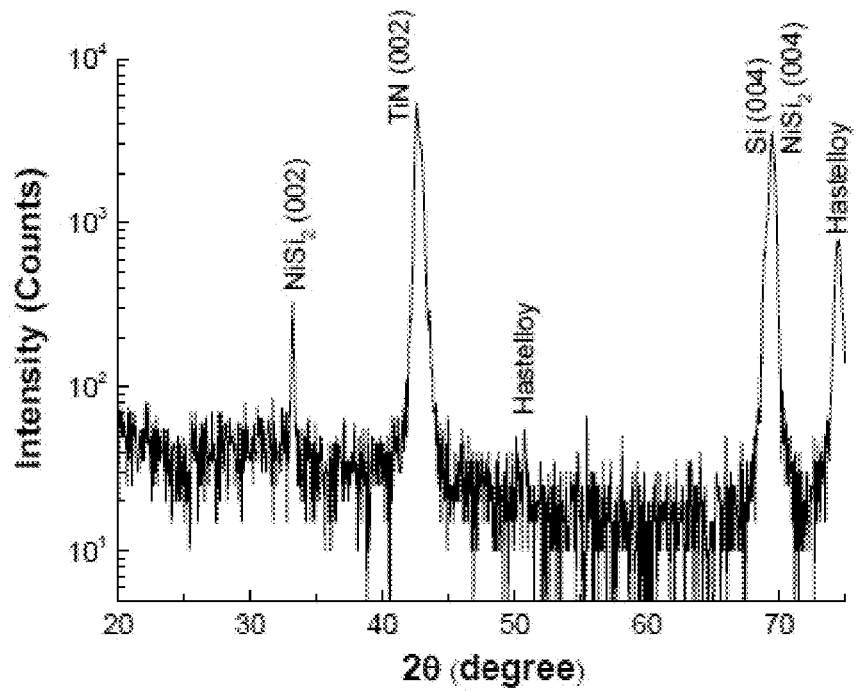
FIG. 7 is a graph illustrating a $\theta$-2$\theta$ X-ray diffraction scan of an epitaxial Si layer deposited on an epitaxial $NiSi_2$ buffer layer deposited on a TiN film on an IBAD template layer on a metal substrate, in accordance with an embodiment.
Figure 8:
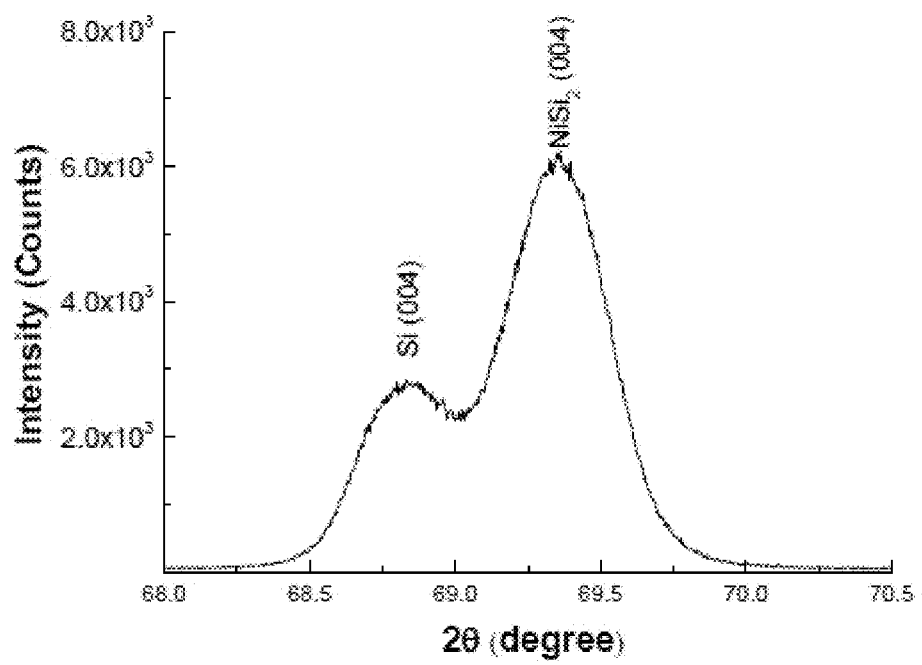
FIG. 8 is a graph illustrating a high resolution X-ray diffraction scan of (004) peak of an epitaxial Si layer deposited on an epitaxial $NiSi_2$ buffer layer deposited on a TiN film on an IBAD template layer on a metal substrate, in accordance with an embodiment.

FIG. 7, by way of example only, is a graph illustrating a θ-2θ X-ray diffraction scan of an epitaxial Si layer deposited/grown on an epitaxial $NiSi_2$ buffer layer which is deposited on an epitaxial TiN layer which is deposited on an IBAD template layer. The IBAD template layer is deposited on a metal substrate with intervening oxide layer. As illustrated in the graph of FIG. 7, only Si (004) peak is visible, indicating strong out-of-plane texture and epitaxial growth of silicon. Furthermore, since the lattice constants of Si and $NiSi_2$ are close to each other, the (004) peaks of both appear merged in a conventional X-ray diffraction scan. FIG. 8, by way of example only, is a high resolution X-ray diffraction of the Si film graphed in FIG. 7, and which shows an Si (004) peak clearly distinguishable from a $NiSi_2$ (004) peak.

Figure 9:
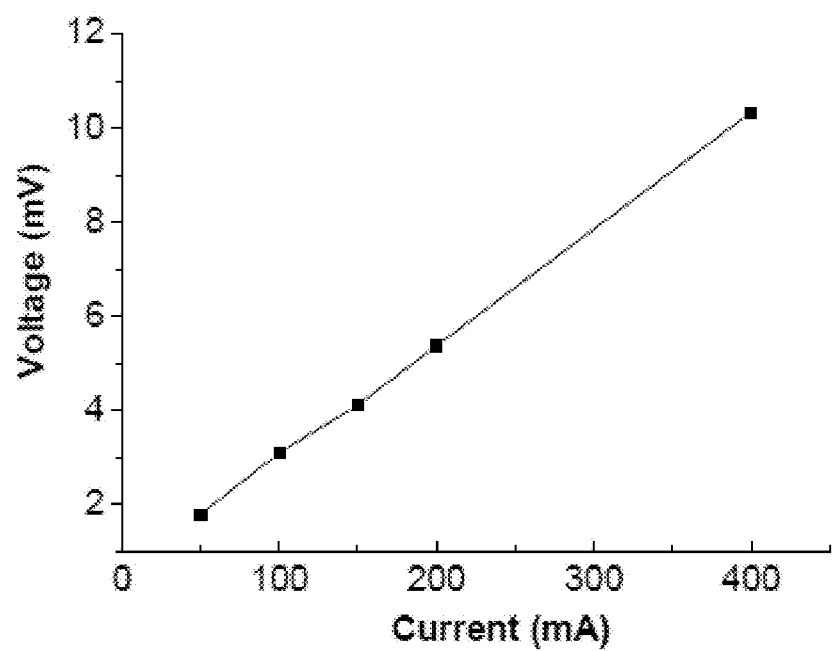
FIG. 9 is a graph illustrating a current-voltage characteristic of resistivity measurements by a four-probe method of an epitaxial $NiSi_2$ layer deposited on a TiN film on an IBAD template layer on a metal substrate, in accordance with an embodiment.

FIG. 9, by way of example only, is a graph illustrating a current-voltage characteristic from resistivity measurements by a four-probe method (the four-probe method is known to those of ordinary skill in the art) of an epitaxial $NiSi_2$ layer deposited on an epitaxial TiN layer which is deposited on an IBAD template layer. The IBAD template layer is deposited on a metal substrate with an intervening amorphous layer. The current-voltage characteristics show a low resistivity value of only 5 μΩcm for the $NiSi_2$ layer. Such a low resistivity value, in conjunction with a TiN or an equivalent electrically conductive layer, enable an electrical contact between the active semiconductor layers and the bottom of the metal substrate (or metal film on a glass substrate). The metal substrate or metal film on the glass substrate function as a bottom contact bottom electrode.

In an embodiment, the epitaxial growth of an electrically-conductive non-oxide fluorite structure (e.g., $NiSi_2$) on an IBAD template can enable bottom contact bottom electrode(s) for semiconductor devices, such as solar cells and flexible electronics.

Figure 10:
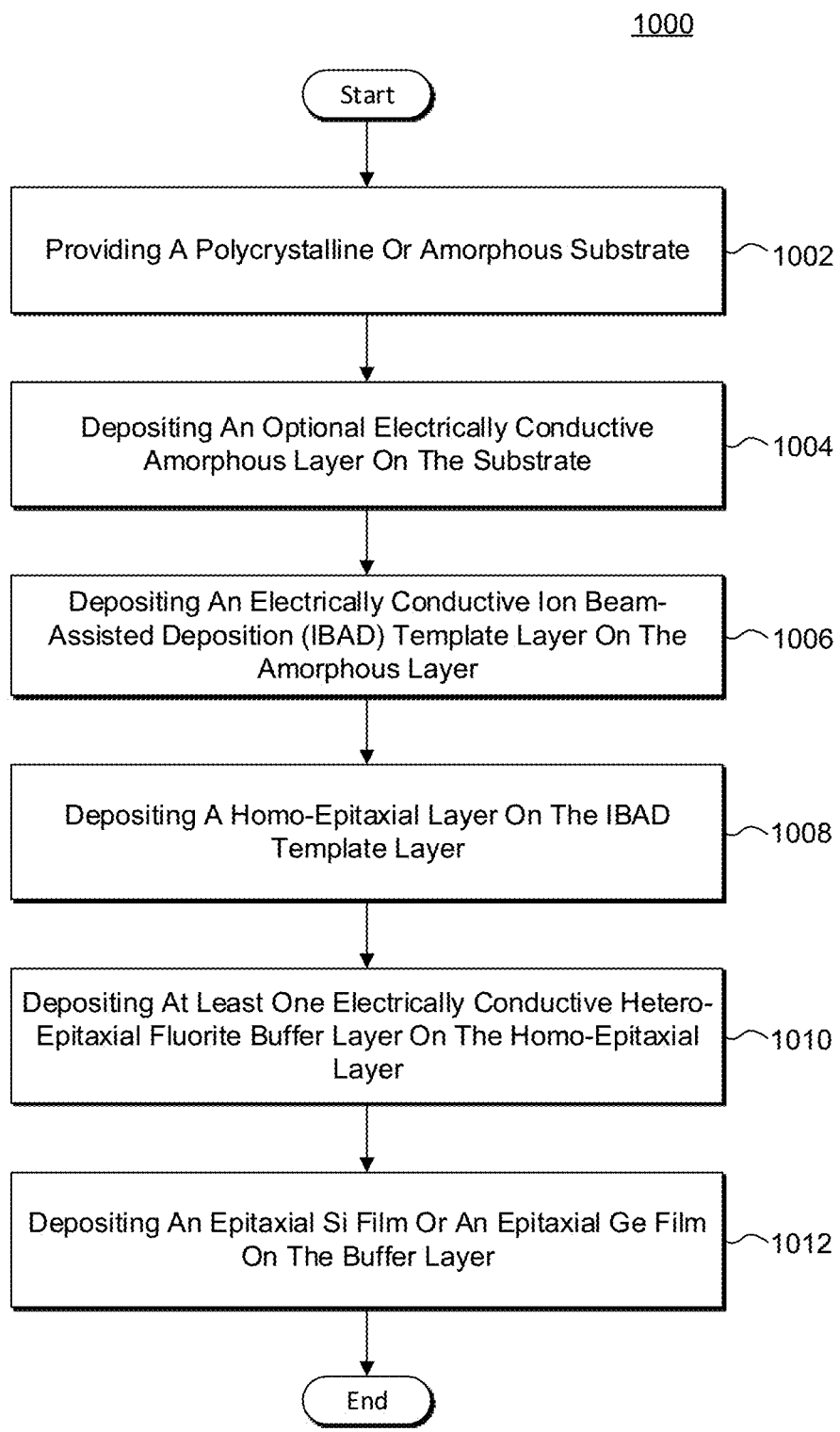
FIG. 10 is a flowchart illustrating an embodiment of a method for fabricating a semiconductor device that fosters the use of a bottom electrode and which avoids complex and expensive lithography processes, in accordance with an embodiment.

FIG. 10, by way of example only, is a flowchart illustrating an embodiment of a method 1000 for fabricating a semiconductor device. In an embodiment, a polycrystalline or amorphous substrate can be provided (block 1002). Examples of polycrystalline substrates can include Hastelloy, Stainless Steel, Ni—W and Inconel. Examples of amorphous substrates may include glass, quartz, and metallic glasses. Optionally, an electrically conductive amorphous layer can then be deposited on the substrate (block 1004). Examples of amorphous layers can include TiN and Ta—Ni.

An electrically conductive Ion Beam-Assisted Deposition (IBAD) template layer can then be deposited on the optional amorphous layer (block 1006) or directly on the substrate. Examples of IBAD templates can include TiN. Next, a homo-epitaxial layer can be deposited on the IBAD template layer (block 1008), and at least one electrically conductive hetero-epitaxial buffer layer can be deposited on the homo-epitaxial layer (block 1010). Examples of homo-epitaxial layers can include TiN. Examples of hetero-epitaxial buffer (fluorite) layers can include $NiSi_2$. In one embodiment, the at least one hetero-epitaxial buffer layer has a resistivity of less than approximately 100 µΩcm. In another embodiment, the at least one electrically conductive hetero-epitaxial buffer layer uses a conductive fluorite material (e.g., $NiSi_2$). Finally, an epitaxial Si film or an epitaxial Ge film can be deposited on the buffer layer (block 1012).

Embodiments are directed to a semiconductor device comprising: a polycrystalline or amorphous substrate; an electrically conductive Ion Beam-Assisted Deposition (IBAD) template layer positioned above the substrate; and at least one electrically conductive hetero-epitaxial buffer layer positioned above the IBAD template layer. The at least one buffer layer has a resistivity of less than 100 µΩcm.

In an embodiment, the IBAD template layer comprises Titanium Nitride (TiN).

In an embodiment, the at least one buffer layer does not comprise an oxide.

In an embodiment, the at least one buffer layer comprises a fluorite structure.

In an embodiment, the at least one buffer layer comprises Nickel Silicide ($NiSi_2$).

In an embodiment, the semiconductor device further comprises an electrically conductive amorphous layer positioned between the substrate and the IBAD template layer.

In an embodiment, the amorphous layer comprises Titanium Nitride (TiN) or Tantalum-Nickel (Ta—Ni).

In an embodiment, the semiconductor device further comprises an epitaxial Si film or an epitaxial Ge film positioned above the buffer layer.

In an embodiment, the semiconductor device further comprises an epitaxial Si film positioned above the buffer layer, and p-doped and n-doped silicon positioned above the epitaxial Si film, thereby forming a solar cell device or flexible electronics device.

In an embodiment, the semiconductor device further comprises an epitaxial Ge film positioned above the buffer layer, and epitaxial GaAs film positioned on the epitaxial Ge film, and epitaxial p-doped and epitaxial n-doped GaAs layers positioned on the epitaxial GaAs film, thereby forming a solar cell device.

In an embodiment, the substrate comprises metal.

In an embodiment, the substrate comprises metal and functions as a bottom electrode.

In an embodiment, the substrate comprises glass.

In an embodiment, the semiconductor device further comprises a bottom electrode positioned below and attached to the substrate.

In an embodiment, the substrate is Hastelloy C-276 or Stainless Steel or Ni—W or Ni—Cr or Inconel or copper or a combination thereof.

In an embodiment, the semiconductor device further comprises a homo-epitaxial layer positioned between the IBAD template layer and the buffer layer.

In an embodiment, the homo-epitaxial layer comprises TiN.

Embodiments are also directed to a method for fabricating a semiconductor device. The method comprises: providing a polycrystalline or amorphous substrate; depositing an electrically conductive Ion Beam-Assisted Deposition (IBAD) template layer on the substrate; and depositing at least one electrically conductive hetero-epitaxial buffer layer on the IBAD template layer. The at least one buffer layer has a resistivity of less than 100 µΩcm.

In an embodiment, the depositing of the IBAD template layer is performed via dual ion sources.

In an embodiment, the depositing of the buffer layer is performed via magnetron sputtering.

In an embodiment, the method further comprises depositing a homo-epitaxial layer between the depositing of the IBAD template layer and the depositing of the buffer layer.

In an embodiment, the depositing of the homo-epitaxial layer is performed via magnetron sputtering.

In an embodiment, the method further comprises depositing an epitaxial Si film or an epitaxial Ge film on the buffer layer.

In an embodiment, the depositing of the epitaxial Si film or the epitaxial Ge film is performed via magnetron sputtering or plasma enhanced chemical vapor deposition (PECVD).

In an embodiment, the method further comprises depositing an epitaxial Si film above the buffer layer, and depositing p-doped and n-doped silicon above the epitaxial Si film, thereby forming a solar cell device or flexible electronics device.

In an embodiment, the method further comprises depositing an epitaxial Ge film above the buffer layer, and depositing epitaxial GaAs film on the epitaxial Ge film, and depositing epitaxial p-doped and epitaxial n-doped GaAs layers on the epitaxial GaAs film, thereby forming a solar cell device.

In an embodiment, the method further comprises depositing p-doped and n-doped electrically conductive semiconductor layers which are Si-based and III-V-based above the epitaxial Si film or the epitaxial Ge film.

In an embodiment, the method further comprises depositing a bottom electrode on a bottom surface of the substrate.

In an embodiment, the method further comprises depositing an electrically conductive amorphous layer between the substrate and the IBAD template layer.

In an embodiment, the amorphous layer comprises Titanium Nitride (TiN) or Tantalum-Nickel (Ta—Ni).

In an embodiment, the depositing of the amorphous layer is performed via magnetron sputtering.

Although the embodiments in method 1000 (or any other method disclosed herein) are described above with reference to deposition of various layers, the deposition of any or all of the above-mentioned layers above the IBAD template layer is hereby defined to include epitaxial growth of the layers. Furthermore, it's understood that method 1000 (or any other method disclosed herein) can implement any of the materials and processes described above with respect to FIG. 3.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

Example

A tape of Hastelloy C-276 was electropolished to a surface roughness of 1 nm and serves as a substrate. A 30-100 nm thick layer of TiN was deposited at room temperature by magnetron sputtering on the Hastelloy substrate. The TiN was found to be amorphous by X-ray diffraction. Alternatively, an amorphous layer of Ta—Ni was deposited by magnetron sputtering over the Hastelloy substrate, at room temperature. Next, a 10 nm thick layer of TiN was deposited by IBAD using dual ion sources, at room temperature. A beam voltage of 200 V-1500 V was used for the sputter and assist ion sources. The assist ion source was directed at an angle of 45° to the substrate normal. The development of biaxial texture in the TiN film was confirmed by in-situ reflection high energy electron diffraction (RHEED). Next, a homo-epitaxial layer/film of TiN was deposited at a temperature in the range of 300° C. to 800° C. by magnetron sputtering. A hetero-epitaxial layer of $NiSi_2$ was then deposited on this TiN film at a temperature in the range of 400° C. to 800° C. by magnetron sputtering. The epitaxial growth of TiN and $NiSi_2$ was confirmed by X-ray diffraction. Si films were epitaxially grown atop the epitaxial $NiSi_2$ film by magnetron sputtering and/or plasma enhanced chemical vapor deposition (PECVD) at a temperature in the range of 300° C. to 850° C. This silicon film was used as a base layer for growing epitaxial films of p-doped (boron-doped) and n-doped (phosphorous-doped) silicon to fabricate a solar cell or flexible electronics device. Alternatively, instead of epitaxial Si, an epitaxial film of germanium was grown atop the epitaxial $NiSi_2$ film by magnetron sputtering and/or PECVD. The Ge film was used as a base layer for subsequent epitaxial growth of GaAs by metal organic chemical vapor deposition (MOCVD). This epitaxial GaAs film was used for epitaxial growth of p-doped (Zn-doped) and n-doped (Si-doped) GaAs films to construct a solar cell device.

What is claimed is:

1. A semiconductor device comprising:
a polycrystalline or amorphous substrate;
an electrically conductive Ion Beam-Assisted Deposition (IBAD) template layer positioned above the substrate; and
at least one electrically conductive hetero-epitaxial buffer layer positioned above the IBAD template layer, wherein the at least one buffer layer has a resistivity of less than 100 μΩcm, and wherein the at least one buffer layer comprises a fluorite structure that has a (004) out-of-plane orientation;
wherein the substrate comprises metal and functions as a back contact bottom electrode, or the semiconductor device further comprises a back contact bottom electrode positioned below the substrate.

2. The semiconductor device of claim 1, wherein the IBAD template layer comprises Titanium Nitride (TiN).

3. The semiconductor device of claim 1, wherein the at least one buffer layer does not comprise an oxide.

4. The semiconductor device of claim 1, wherein the fluorite structure comprises Nickel Silicide ($NiSi_2$).

5. The semiconductor device of claim 1, further comprising an electrically conductive amorphous layer positioned between the substrate and the IBAD template layer.

6. The semiconductor device of claim 5, wherein the amorphous layer comprises Titanium Nitride (TiN) or Tantalum-Nickel (Ta—Ni).

7. The semiconductor device of claim 1, further comprising an epitaxial Si film or an epitaxial Ge film positioned above the at least one buffer layer.

8. The semiconductor device of claim 1, further comprising an epitaxial Si film positioned above the at least one buffer layer, and p-doped and n-doped silicon positioned above the epitaxial Si film, thereby forming a solar cell device or flexible electronics device.

9. The semiconductor device of claim 1, further comprising an epitaxial Ge film positioned above the at least one buffer layer, and epitaxial GaAs film positioned on the epitaxial Ge film, and epitaxial p-doped and epitaxial n-doped GaAs layers positioned on the epitaxial GaAs film, thereby forming a solar cell device.

10. The semiconductor device of claim 1, wherein the substrate comprises metal.

11. The semiconductor device of claim 1, wherein the substrate comprises metal and functions as a bottom electrode.

12. The semiconductor device of claim 1, wherein the substrate comprises glass.

13. The semiconductor device of claim 1, further comprising a bottom electrode positioned below and attached to the substrate.

14. The semiconductor device of claim 1, wherein the substrate is Hastelloy C-276 or Stainless Steel or Ni—W or Ni—Cr or Inconel or copper or a combination thereof.

15. The semiconductor device of claim 1, further comprising a homo-epitaxial layer positioned between the IBAD template layer and the at least one buffer layer.

16. The semiconductor device of claim 15, wherein the homo-epitaxial layer comprises TiN.

17. The semiconductor device of claim 4, wherein the fluorite structure has a resistivity of 5 μΩcm.

* * * * *